(12) United States Patent
Yasui et al.

(10) Patent No.: US 7,442,986 B2
(45) Date of Patent: Oct. 28, 2008

(54) NONVOLATILE SEMICONDUCTOR MEMORY DEVICE WITH TAPERED SIDEWALL GATE AND METHOD OF MANUFACTURING THE SAME

(75) Inventors: Kan Yasui, Kodaira (JP); Digh Hisamoto, Kokubunji (JP); Shinichiro Kimura, Kunitachi (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/797,839

(22) Filed: May 8, 2007

(65) Prior Publication Data

US 2007/0207581 A1    Sep. 6, 2007

Related U.S. Application Data

(63) Continuation of application No. 10/901,347, filed on Jul. 29, 2004, now Pat. No. 7,235,441.

(30) Foreign Application Priority Data

Oct. 20, 2003    (JP) .............................. 2003-359280

(51) Int. Cl.
    *H01L 29/788*    (2006.01)
(52) U.S. Cl. .................... 257/316; 257/324; 257/E29.3
(58) Field of Classification Search ................ 257/315, 257/316, 324, E29.3
    See application file for complete search history.

(56) References Cited

U.S. PATENT DOCUMENTS 5,869,858 A    2/1999 Ozawa et al. ............... 257/296

6,365,459 B1 *    4/2002 Leu ............................. 438/266
6,368,976 B1 *    4/2002 Yamada ...................... 438/713
6,465,837 B1    10/2002 Wu ............................. 257/315

(Continued)

FOREIGN PATENT DOCUMENTS

JP    5-48113    2/1993

(Continued)

OTHER PUBLICATIONS

S. Kianian et al., "A Novel 3 Volts-Only, Small Sector Erase, High Density Flash $E^2$PROM", IEEE 1994 Symposium on VLSI Technology Digest of Technical Papers, pp. 71-72.

(Continued)

*Primary Examiner*—M. Wilczewski
*Assistant Examiner*—Toniae M. Thomas
(74) *Attorney, Agent, or Firm*—Miles & Stockbridge P.C.

(57) ABSTRACT

In a split gate type nonvolatile memory cell in which a MOS transistor for a nonvolatile memory using a charge storing film and a MOS transistor for selecting it are adjacently formed, the charge storing characteristic is improved and the resistance of the gate electrode is reduced. In order to prevent the thickness reduction at the corner portion of the charge storing film and improve the charge storing characteristic, a taper is formed on the sidewall of the select gate electrode. Also, in order to stably perform a silicide process for reducing the resistance of the self-aligned gate electrode, the sidewall of the select gate electrode is recessed. Alternatively, a discontinuity is formed between the upper portion of the self-aligned gate electrode and the upper portion of the select gate electrode.

6 Claims, 16 Drawing Sheets

U.S. PATENT DOCUMENTS

| | | | |
|---|---|---|---|
| 6,646,301 B2 * | 11/2003 | Yamada | 257/320 |
| 6,927,133 B2 * | 8/2005 | Takahashi | 438/267 |
| 7,253,470 B1 * | 8/2007 | Liu et al. | 257/316 |
| 2003/0034518 A1 * | 2/2003 | Yoshikawa | 257/315 |
| 2004/0094794 A1 | 5/2004 | Wu | 257/316 |
| 2004/0119107 A1 | 6/2004 | Hisamoto et al. | 257/314 |
| 2006/0234454 A1 * | 10/2006 | Yasui et al. | 438/267 |

FOREIGN PATENT DOCUMENTS

| | | |
|---|---|---|
| JP | 5-121700 | 5/1993 |
| JP | 2005-123518 A * | 5/2005 |

OTHER PUBLICATIONS

W. Chen et al., "A Novel Flash Memory Device with Split Gate Source Side Injection and ONO Charge Storage Stack (SPIN)", IEEE 1997 Symposium on VLSI Technology Digest of Technical Papers, pp. 63-64.

* cited by examiner

NONVOLATILE SEMICONDUCTOR MEMORY DEVICE WITH TAPERED SIDEWALL GATE AND METHOD OF MANUFACTURING THE SAME

This application is a continuation of application Ser. No. 10/901,347 filed Jul. 29, 2004 (now U.S. Pat. No. 7,235,441).

CROSS-REFERENCE TO RELATED APPLICATION

The present application claims priority from Japanese patent application No. JP 2003-359280 filed on Oct. 20, 2003, the content of which is hereby incorporated by reference into this application.

BACKGROUND OF THE INVENTION

The present invention relates to a nonvolatile semiconductor memory device and a manufacturing technique thereof. More particularly, the present invention relates to a technique effectively applied to a nonvolatile semiconductor memory device embedded on the same substrate along with a semiconductor device having a logic operating function, for example, a microcomputer.

By embedding a semiconductor nonvolatile memory cell on the same silicon substrate along with a logic semiconductor device, a high-performance semiconductor device can be formed. Such a semiconductor device is widely used as an embedded microcomputer in industrial equipment, household appliances, and in-vehicle equipment, etc. Usually, the nonvolatile memory embedded on the same substrate along with the microcomputer stores the program required by the microcomputer, and the program is read and used as occasion demands. As a cell structure of the nonvolatile memory suitable to be embedded along with the logic semiconductor device, a split gate type memory cell composed of a select MOS transistor and a memory MOS transistor can be used. Since adoption of this structure makes it possible to reduce the area of a peripheral circuit for controlling the memory, it is primarily used. The relating technical documents are, for example, Japanese Patent Laid-Open No. 5-048113 (hereinafter "Patent Document 1"); Japanese Patent Laid-Open No. 5-121700 ("Patent Document 2"); IEEE, VLSI Technology Symposium, 1994 proceedings, pp. 71-72 ("Non-patent Document 1"); and IEEE, VLSI Technology Symposium, 1997 proceedings, pp. 63-64 ("Non-patent Document 2").

As a charge storing structure of the memory MOS transistor, a floating gate structure in which charges are stored in an electrically isolated conductive polysilicon (Patent Document 2 and Non-patent Document 1) and a MONOS structure in which charges are stored in an insulator such as a silicon nitride film that has a characteristic to store the charges (Patent Document 1 and Non-patent Document 2) are available. The floating gate structure is widely used in a code storage flash memory for a mobile phone and a data storage large-capacity flash memory and has good charge storing characteristic. However, it becomes more and more difficult to acquire a coupling ratio required for potential control of the floating gate due to the further scaling down, and its structure becomes complicated. In order to prevent the leakage of the retained charge, a thickness of about 8 nm or more is required for an oxide film surrounding the floating gate, and therefore scaling down for the purpose of higher speed operation and higher integration are reaching its limit. Since the charges are stored in the conductor, they are largely influenced by the defect of the oxide film to be a leakage path and the charge storing time is extremely reduced in the memory cell having the defect of the oxide film. Meanwhile, the MONOS structure is usually inferior to the floating gate structure in the charge storing characteristic, and the threshold voltage has a tendency to be decreased with a logarithm of time. Therefore, the MONOS structure is used only in the limited products though it has been known from a long time ago. However, since the charges are stored in the insulator, the MONOS structure is not so much influenced by the defect of the oxide film and can use the thin oxide film with a thickness of 8 nm or less. Therefore, it is suitable for the further reduction in size. Also, since the charge storing time is not extremely decreased due to the defect in the MONOS structure, its reliability can be easily expected, and since the memory cell structure is simple, it can be easily embedded along with the logic circuit. For these reasons, with the advance of the reduction in size, the MONOS structure has recently been drawn attention to again.

As the split gate structure particularly suitable for the reduction in size, the structure in which one of the MOS transistors is formed of a sidewall using a self-aligned manner is available (Patent Document 1 and Non-patent Document 2). In this case, an alignment margin of photolithography is unnecessary, and gate length of the transistor formed by the self-aligned manner can be made equal to or smaller than the minimum resolution dimension. Therefore, it is possible to form the finer memory cell in comparison to the conventional structure in which each of the two transistors is formed by using a photomask.

Among the split gate memory cells using the self-aligned manner, the cell, as disclosed in Non-patent Document 2, in which the self-aligned gate is formed by using the MONOS structure, is suitable to be mounted along with the high-speed logic circuit. Since the select gate side is first formed because of a structural reason, the select gate and the gate oxide film of the logic circuit portion simultaneously formed can be formed with the interface of the silicon substrate being in good condition. Since the transistor with a thin film gate for the high-speed operation that is sensitive to the interface quality can be formed, the performance of the logic circuit fabricated together and the select gate is improved.

SUMMARY OF THE INVENTION

The memory cell in which the MONOS structure is used to form the self-aligned gate is in principle suitable for the reduction in size and the increase in operation speed. However, it also has the problems as follows. That is, the charge storing characteristic falls below the actually expected level due to the memory cell structure and the manufacturing margin of the self-aligned gate electrode is small.

As for the charge storing characteristic, a silicon oxide film 11, a silicon nitride film 12, and a silicon oxide film 13 (defined as an "ONO film" hereinafter) to be an insulator of a self-aligned gate electrode 10 has an L-shaped corner portion 14 when viewed from a section vertical to the word line, as shown in FIG. 2. Electrons are mainly injected to the silicon nitride film near the L-shaped corner by a write operation using a source side injection method. The silicon oxide film 11 to be a lower layer of the ONO film (defined as a "bottom oxide film") is usually formed by the thermal oxidation process, while the silicon nitride film 12 to be an intermediate layer thereof and the silicon oxide film 13 to be an upper layer thereof (defined as a "top oxide film") are formed by the chemical vapor deposition (CVD). Due to the nature of the CVD, the thickness of the silicon nitride film 12 and the silicon oxide film 13 tends to be locally reduced at each corner portion. Usually, the thickness reduction at the corner portion is eminent in the silicon oxide film in comparison to the silicon nitride film. For example, in the CVD for depositing a silicon oxide film by the thermal decomposition of a usual source gas such as silane, the deposition thickness on the vertical pattern sidewall is less than 80% of that of the flat portion, and the thickness near the corner portion is further reduced. Since the thickness of the top oxide film for preventing the leakage of the charges in the silicon nitride film is reduced at the corner portion in which the charge density is high, the charge storing characteristic falls below the level actually expected from the deposited thickness. Although it is possible to improve the charge storing characteristic by increasing the deposition thickness of the top oxide film, the increase of the gate insulator thickness is not preferable because it causes the degradation of transistor characteristic such as the reduction of on current.

Next, the manufacturing margin of the self-aligned gate electrode will be described with reference FIG. 2. After forming the ONO films 11 to 13 on a select transistor 15 formed in advance, polysilicon doped with an impurity to be a material of the electrode is deposited, and then the polysilicon is etched back by the anisotropic dry etching. By so doing, the polysilicon is left only on the sidewalls of the gate electrode of the select transistor. In this manner, the self-aligned gate electrode 10 is formed as a sidewall. Subsequently, after the sidewall made of the polysilicon on one side is removed, sidewalls 16 and 17 each made of a silicon oxide film are formed once again, and then the memory cell structure shown in FIG. 2 is completed. The outer sidewall 17 made of a silicon oxide film has a function to prevent the short-circuit between a silicide portion 18 of the self-aligned gate electrode and a silicide portion 19 of a high-concentration diffusion layer on the silicon substrate in the silicide process. However, since the underlying layer of the outer sidewall 17 made of a silicon oxide film is a curved sidewall surface of the self-aligned electrode 10, the process margin in the anisotropic etching is small and thus it becomes difficult to appropriately perform the etching. As a result, the part of the electrode to be silicided (corresponding to the silicide portion 18 of the self-aligned gate electrode) cannot be appropriately exposed. Alternatively, there easily arises the drawback of the fact that the isolation distance from the high-concentration diffusion layer becomes insufficient and short-circuited. Furthermore, there is also the structural problem that the short circuit tends to occur between the silicides due to the short distance between the self-aligned electrode 10 and the select gate electrode 15. An object of the present invention is to provide a method of ensuring a sufficient process margin required in the silicide process.

Another object of the present invention is to provide a technique capable of improving the charge storing characteristic without increasing the total film thickness in a nonvolatile semiconductor memory device.

Still another object of the present invention is to provide a technique for ensuring sufficient process margin required in the silicide process in a nonvolatile semiconductor memory device.

The above and other objects and novel characteristics of the present invention will be apparent from the description of this specification and the accompanying drawings.

Outlines of the typical ones of the inventions disclosed in this application will be briefly described as follows.

In order to achieve the above-described first object, that is, the improvement of the charge storing characteristic, an angle between the sidewall surface of the select gate and the substrate surface is controlled within an appropriate range. More specifically, an angle 20 between a surface of an insulator formed on a side surface of the select gate electrode and a silicon substrate surface just before the deposition of a silicon nitride film to be a charge storing film is controlled within a range between 95 and 180 degrees except for 180 degrees, as shown in FIG. 3. For its achievement, a taper angle 61 of a side surface of the select gate electrode is controlled before forming the insulator. The taper angle 61 varies depending on the method of forming the insulator. When the insulator is formed by the wet oxidation, the taper angle is controlled within the range of 100 and 180 degrees except for 180 degrees, and when the insulator is formed by the dry oxidation or the ISSG oxidation, the taper angle is controlled within the range of 95 and 180 degrees except for 180 degrees. The taper of the sidewall of the select gate electrode can be controlled depending on the conditions of the dry etching. When the angle between the select gate sidewall and the substrate surface varies to an obtuse angle, step coverage of the CVD is improved and the thickness reduction of the silicon nitride film and the silicon oxide film at the corner portion can be prevented. However, when the angle is excessively increased, the area occupied by the gate electrode is increased and the reduction in size is hindered. Also, since the lower edge of the select gate is inversely formed into an acute shape, the reliability is reduced due to the concentration of electric field. Therefore, it is preferable to limit the angle increase to at most 150 degrees.

As for the above-described second object, that is, the increase of the manufacturing margin in the silicide process of the gate electrode, in order to form the self-aligned electrode to have a shape preferable to the silicide process, a recess amount 21 of the sidewall of the select gate is controlled to be one-third or more of the gate length of the self-aligned gate electrode 10, as shown in FIG. 4. Since polysilicon to be the material of the self-aligned gate electrode has good step coverage in the CVD with respect to the recessed shape of the select gate sidewall, it is deposited so as to overhang along the shape of the sidewall. Owing to the overhang portion, the gate length of the self-aligned gate electrode 10 is hardly varied even if an etch back amount in the anisotropic etching is increased. In addition, since the discontinuity of the slope denoted by the reference symbol 22 is surely formed on the self-aligned gate electrode 10, the shape of the outer sidewall 17 made of a silicon oxide film formed sequentially can be easily controlled. For the silicide process of the self-aligned gate electrode 10, the outer sidewall 17 made of a silicon oxide film is required to be etched back until the portion to be the silicide portion 18 of the self-aligned gate electrode is exposed. Meanwhile, the etch back amount thereof is limited so as to prevent the short-circuit between the silicides by ensuring the sufficient isolation distance between the silicide portion 19 of the high-concentration diffusion layer on the substrate and the self-aligned gate electrode 10. In order to satisfy both conditions, it is preferable that, in the etching back, the removal rate of the region which covers the part to be the silicide portion 18 of the self-aligned gate electrode is high and the removal rate of the sidewall 17 made of a silicon oxide film which isolates the part to be the silicide portion 19 of the high-concentration diffusion layer and the part to be the silicide portion 18 of the self-aligned gate electrode is slow. According to the method of the present invention in which the discontinuity 22 is surely formed on the self-aligned gate electrode 10, the above-mentioned conditions can be easily satisfied because the rate of the anisotropic etch back differs between the part of the sidewall 17 made of a silicon oxide film which covers the self-aligned gate electrode 10 and the part of the sidewall 17 made of a silicon oxide film below the discontinuity 22 of the slope.

The effects obtained by the representative ones of the inventions disclosed in this application will be briefly described as follows.

Since the abnormal thickness reduction at the corner portion of the ONO film which stores the electric charges can be prevented in the MONOS nonvolatile memory using the split gate cell structure, the charge storing characteristic is improved. Particularly, since the charge storing characteristic of the self-aligned memory cell suitable for the reduction in size can be improved, it is possible to provide a microcomputer embedded along with a nonvolatile memory, which can increase the on current and achieve the high-speed operation. In addition, since the memory cell can be reduced in size, it is possible to reduce the manufacturing cost.

Also, since it is possible to stably perform the silicide process of the split gate cell using the self-aligned structure, the yield is enhanced and the manufacturing cost can be reduced. In addition, the low resistance can be achieved by siliciding the self-aligned gate electrode so as to be suitable for the high-speed operation, and it is possible to remove the shunt that is needed to reduce the resistance of the self-aligned gate electrode. Therefore, it is possible to increase the degree of freedom in the layout designing and reduce the memory array area and, as a result, the cost can be reduced.

Furthermore, by a method of recessing the select gate electrode, the gate length of the select gate electrode can be reduced in size over the lower limit of photolithography. Therefore, the on current can be increased and the high-speed operation can be achieved. Also, since the select gate electrode is formed to have an almost vertical sidewall, the damage to the ONO film by the ion implantation can be reduced and the charge storing characteristic can be improved.

By combining the effects mentioned above, it is possible to achieve a MONOS type nonvolatile memory using the split gate cell structure which can achieve the high-speed operation and has a good charge storing characteristic. Therefore, it becomes possible to improve the performance of the embedded microcomputer fabricated along with a nonvolatile memory and to reduce the manufacturing cost thereof.

DESCRIPTION OF THE PREFERRED EMBODIMENTS

Hereinafter, embodiments of the present invention will be described in detail with reference to the accompanying drawings. Note that components having the same function are denoted by the same reference symbol throughout the drawings for describing the embodiments and the repetitive description thereof will be omitted.

Figure 5:
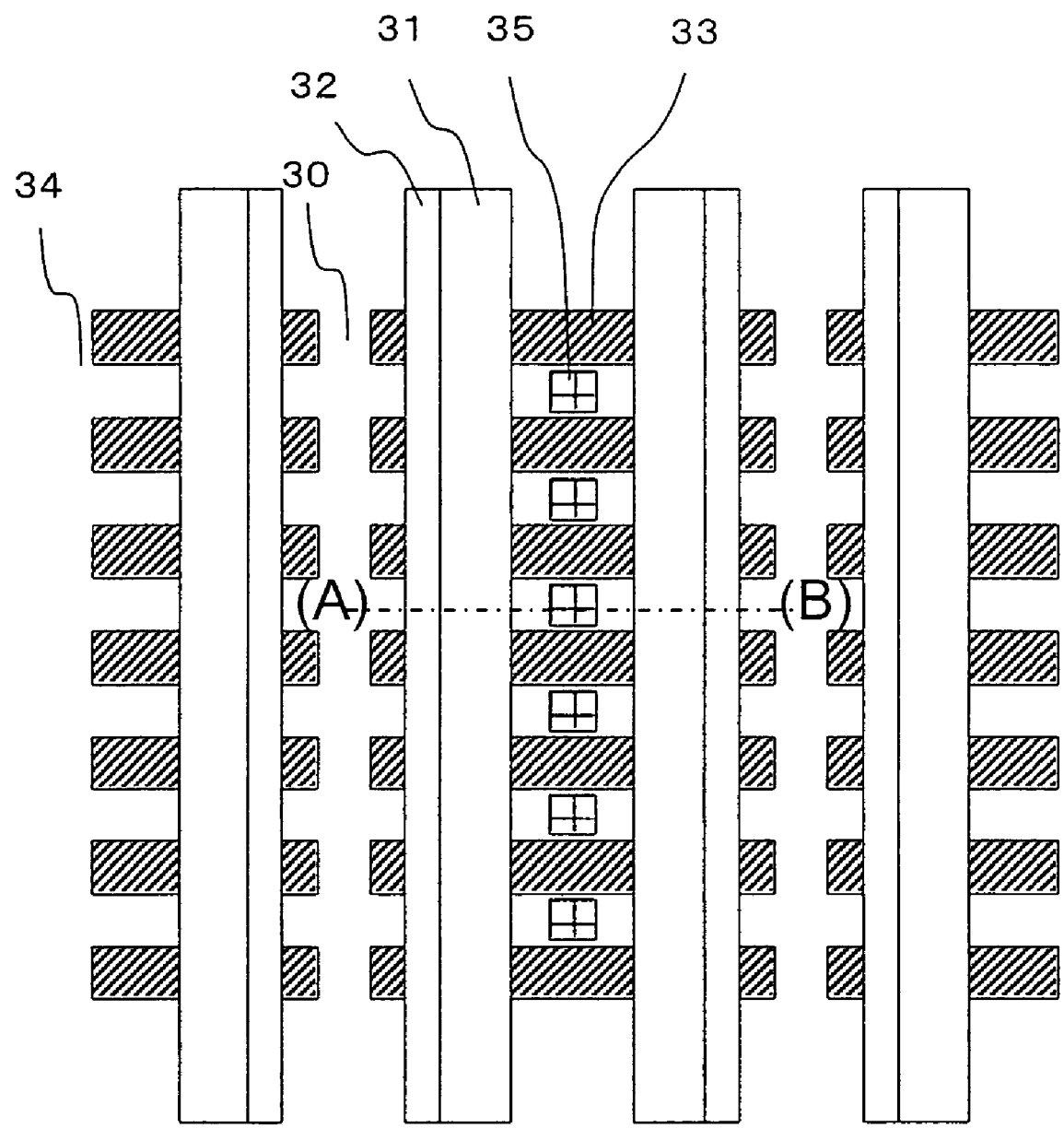
FIG. 5 is a plan view of a memory array according to another embodiment of the present invention.

First, FIG. 5 shows a block diagram of a memory array commonly used in the embodiments below. Each of the memory cells uses a source line 30 in common, and select gate lines 31 to be the gate electrodes of the select transistors which select each memory cell and word lines 32 to be the gate electrodes of the nonvolatile memory MOS transistors are arranged in parallel. The reference numeral 33 in this diagram denotes an isolation region. Bit lines 34 connected to the drains of each memory cell are arranged in a direction vertical to them. The reference numeral 35 in this diagram denotes a contact portion between the drain of the memory cell and the bit line. Hereinafter, the memory cells in each embodiment are realized in the memory array with the above-described structure. However, the memory array structure which can apply the memory cell of the present invention is not limited to this.

First Embodiment

Figure 6:
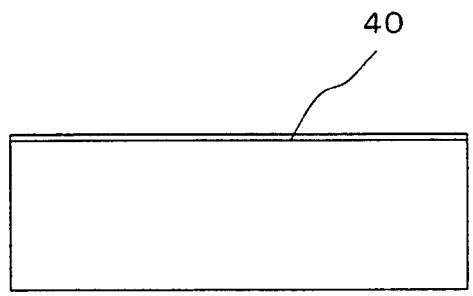
FIG. 6 is a sectional view for describing a manufacturing process of a memory cell in detail according to another embodiment of the present invention.
Figure 7:
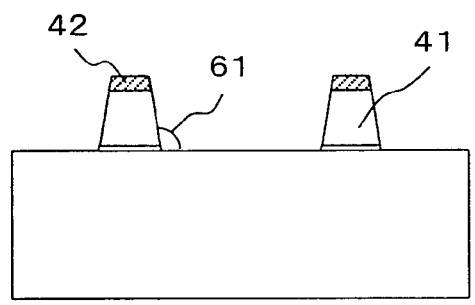
FIG. 7 is a sectional view for describing a manufacturing process of a memory cell in detail according to another embodiment of the present invention.
Figure 8:
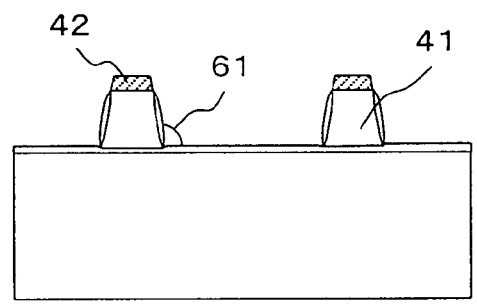
FIG. 8 is a sectional view for describing a manufacturing process of a memory cell in detail according to another embodiment of the present invention.
Figure 9:
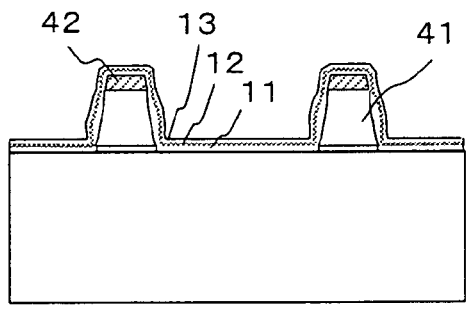
FIG. 9 is a sectional view for describing a manufacturing process of a memory cell in detail according to another embodiment of the present invention.
Figure 10:
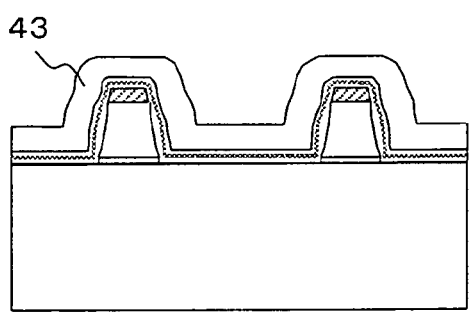
FIG. 10 is a sectional view for describing a manufacturing process of a memory cell in detail according to another embodiment of the present invention.
Figure 11:
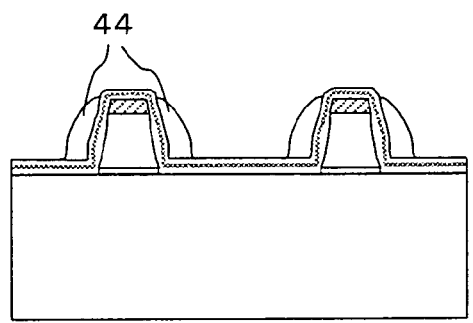
FIG. 11 is a sectional view for describing a manufacturing process of a memory cell in detail according to another embodiment of the present invention.
Figure 12:
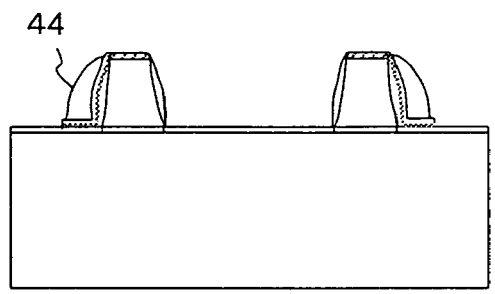
FIG. 12 is a sectional view for describing a manufacturing process of a memory cell in detail according to another embodiment of the present invention.
Figure 13:
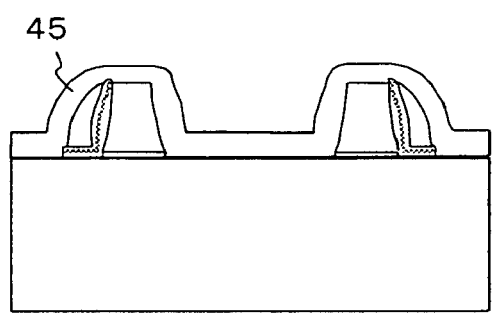
FIG. 13 is a sectional view for describing a manufacturing process of a memory cell in detail according to another embodiment of the present invention.
Figure 14:
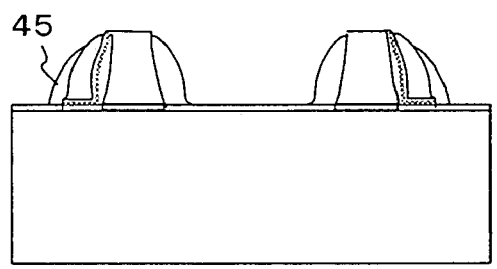
FIG. 14 is a sectional view for describing a manufacturing process of a memory cell in detail according to another embodiment of the present invention.
Figure 15:
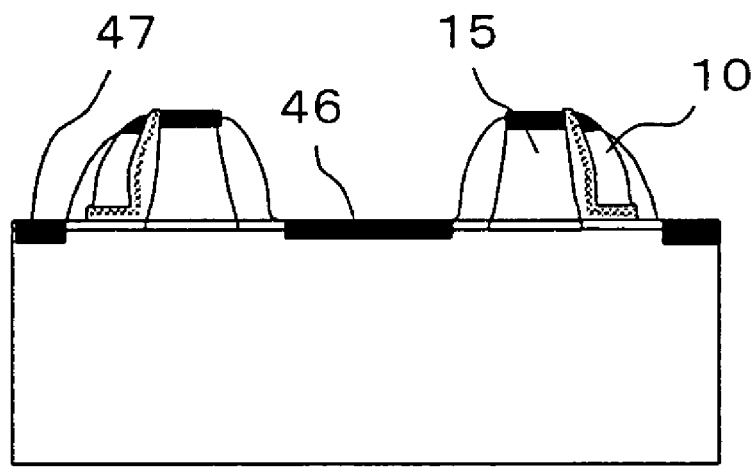
FIG. 15 is a sectional view for describing a manufacturing process of a memory cell in detail according to another embodiment of the present invention.
Figure 16:
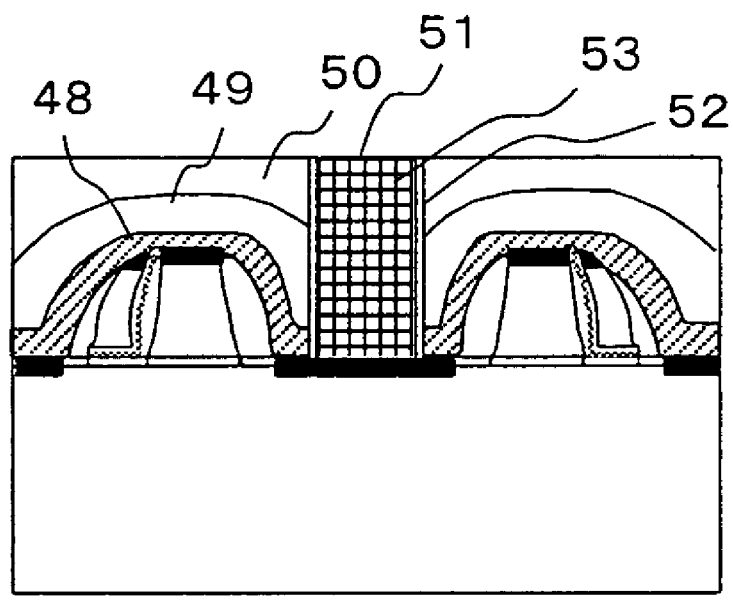
FIG. 16 is a sectional view for describing a manufacturing process of a memory cell in detail according to another embodiment of the present invention.

Hereinafter, a manufacturing process of a memory cell will be described. FIGS. 6 to 16 are enlarged sectional views vertical to the word line of the memory cell and correspond to a sectional view taken along the line (A)-(B) in FIG. 5. The general shallow trench isolation 33 which electrically isolates the devices is formed in the direction vertical to the word line, and a gate oxide film 40 is formed after the sacrificial oxidation of the surface of a silicon substrate for improving the interface quality (FIG. 6). Subsequently, polysilicon 41 with a thickness of 250 nm to be a material of the select gate electrode is deposited by the CVD, and a cap oxide film 42 with a thickness of 50 nm to be a mask in the subsequent process is deposited by the CVD. After coating a photoresist, the photoresist is patterned with a width of 180 nm by the photolithography process, and the cap oxide film 42 is removed by the dry etching with using the photoresist as a mask, and then the polysilicon is removed by the dry etching. The state at this step is shown in FIG. 7. At this time, in order to prevent the abnormal thickness reduction at the corner portion of the ONO film deposited later, a formation angle 61 (taper angle of the select gate electrode) of the sidewall of the select gate electrode is controlled within a range of 95 to 180 degrees except for 180 degrees by reducing the process capability of the dry etching for a vertical surface. Note that, when the angle is excessively increased, the gate length of the select transistor is increased and the characteristic of the transistor is degraded and also the area of the memory cell is increased, which is not preferable from the viewpoint of high integration. Also, since the lower edge of the select gate is inversely formed into an acute shape, the reliability is reduced due to the concentration of electric field. Therefore, the formation angle 61 is preferably set at most 150 degrees. The process capability for a vertical surface may be controlled in a usual way, that is, the carbon content in the source gas may be reduced so as to reduce the deposition of the etching byproduct on the sidewall. Next, the ONO film to be the charge storing film is formed. First, a silicon oxide film with a thickness of 4 to 6 nm is formed as a bottom oxide film by the wet oxidation at 750 to 850° C. as shown in FIG. 8. Next, a silicon nitride film with a thickness of 8 to 12 nm is deposited by the thermal decomposition CVD at 700 to 800° C. Finally, a silicon oxide film with a thickness of 4 to 7 nm is deposited as the top oxide film by the thermal decomposition CVD at 700 to 800° C., as shown in FIG. 9. Note that the top oxide film may be formed by converting 4 to 7 nm of the silicon nitride film into the silicon oxide film by the ISSG (Insitu Steam Generation) oxidation at 900 to 1000° C. In this case, since the silicon nitride film equivalent to 50 to 70% of the silicon oxide film is converted, the thickness of the silicon nitride film is increased by the thickness equivalent to that converted into the oxide film. Then, 50 to 100 nm of polysilicon 43 to be a material of the self-aligned electrode is deposited by the CVD at 450 to 560° C., as shown in FIG. 10. In this case, an impurity such as phosphorus is doped in advance into the polysilicon 43 at a concentration of approximately $5 \times 10^{20}$ atoms/cm$^3$ in order to reduce the electrode resistance. Then, the polysilicon 43 is etched back by using the anisotropic etching, whereby the self-aligned electrodes as shown in FIG. 11 is formed. Since the self-aligned electrodes 44 in the form of spacer are formed on both sides of the select gate electrode, a mask is formed by a resist which boundary is on top of the select gate electrode using the photolithography and one of the self-aligned electrodes 44 is removed by the dry etching. Thereafter, the ONO film exposed on the substrate and on the select gate electrodes is removed by the wet etching using hydrofluoric acid and the wet etching using the hot phosphoric acid, and the state in this step is shown in FIG. 12. Then, an impurity is implanted (not shown) with using the select gate electrodes and the self-aligned electrodes as masks to form the LDD structure. Subsequently, a silicon oxide film 45 with a thickness of 100 nm as a spacer required for the self-aligned electrode is deposited by the CVD, and the state in this step is shown in FIG. 13. Subsequently, the silicon oxide film 45 is etched back by the anisotropic etching, as shown in FIG. 14. The cap oxide films 42 on the select gate electrodes are gradually reduced and removed by the HF cleaning and the dry etching in the process so far. At this time, it is necessary to perform the etch back until the select gates and the polysilicon at the upper part of the self-aligned electrodes are completely exposed. In order to form high-concentration diffusion layers 46 and 47 on the substrate, arsenic and phosphorus are each ion-implanted at a concentration of $1 \times 10^{14}$ to $3 \times 10^{15}$ atoms/cm$^2$ and the thermal processing at 950° C. for 10 seconds is performed to activate the arsenic and phosphorus. In order to reduce each resistance of the high-concentration diffusion layers 46 and 47 and the gate electrode, after a cobalt film is deposited by the sputtering, the cobalt film is silicided by the thermal processing at 500° C. for 1 minute, and then the unreacted cobalt on the silicon oxide film is removed, and the state in this step is shown in FIG. 15. Subsequently, a silicon nitride film 48 with a thickness of 50 nm is deposited by the plasma CVD, and a PSG (phosphosilicate glass) film with a thickness of 300 nm is deposited as an interlayer insulator. Then, after the thermal processing, a silicon oxide film 50 with a thickness of 1200 nm is deposited by the plasma CVD. After planarizing the surface by the CMP (Chemical Mechanical Polishing), the pattern of the contact hole is exposed by the photolithography. Then, after forming a contact hole 51 by the dry etching and depositing titanium nitride 52 in the hole by the sputtering, the hole is sequentially filled with titanium nitride and tungsten by the CVD. The unnecessary tungsten on the silicon oxide film 50, which is the interlayer insulator, is removed by the CVD, and this state is shown in FIG. 16. Note that, though not shown, the cleaning process is appropriately performed between the above-mentioned steps. Thereafter, the front-end process is completed after the usual wiring process (not shown).

Figure 3:
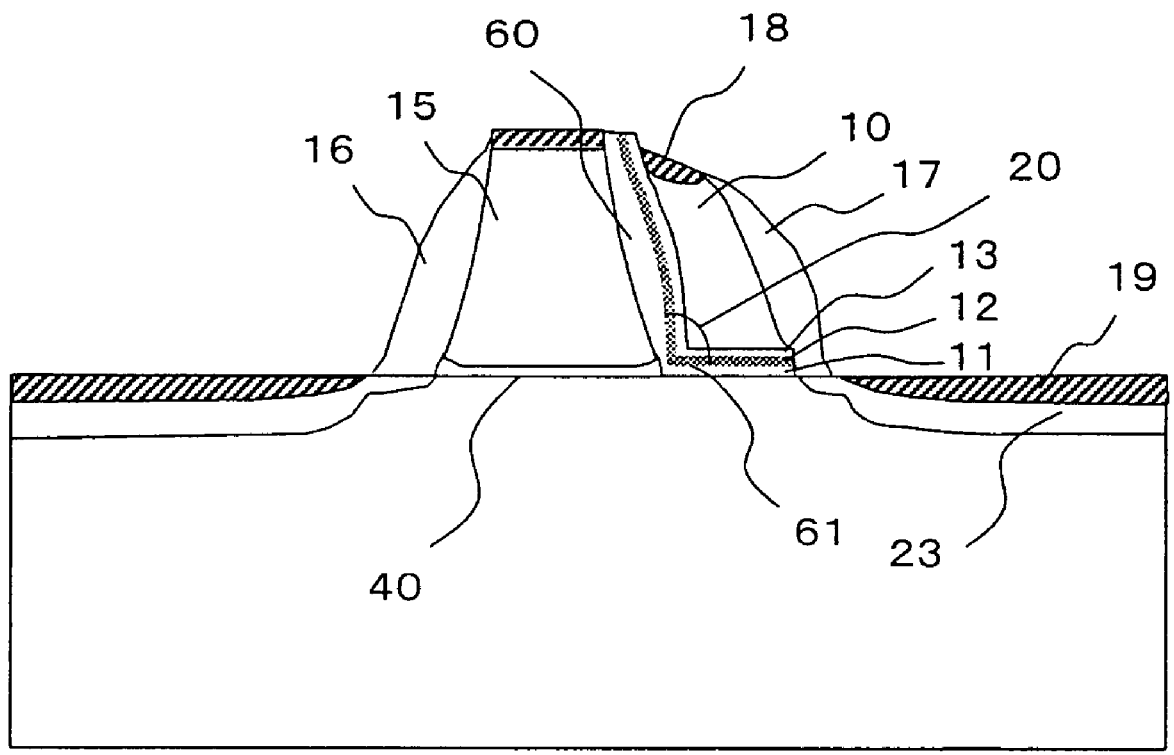
FIG. 3 is a sectional view of a memory cell, in which the taper of the select gate sidewall is controlled, according to an embodiment of the present invention.
Figure 17:
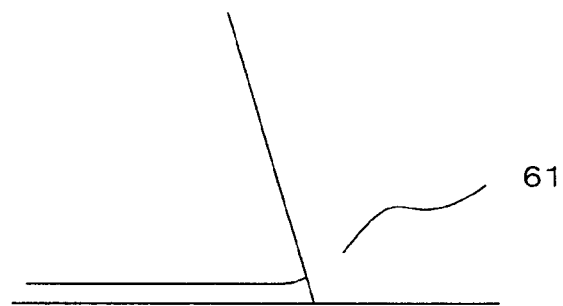
FIG. 17 is an enlarge diagram of a corner portion of a tapered select gate sidewall in a memory cell according to another embodiment of the present invention.
Figure 18:
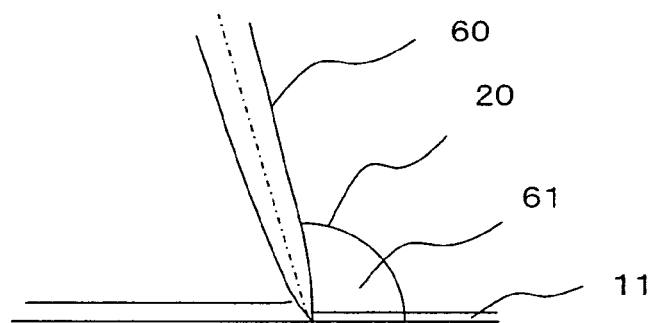
FIG. 18 is an enlarge diagram of a corner portion of a tapered select gate sidewall in a memory cell according to another embodiment of the present invention.
Figure 19:
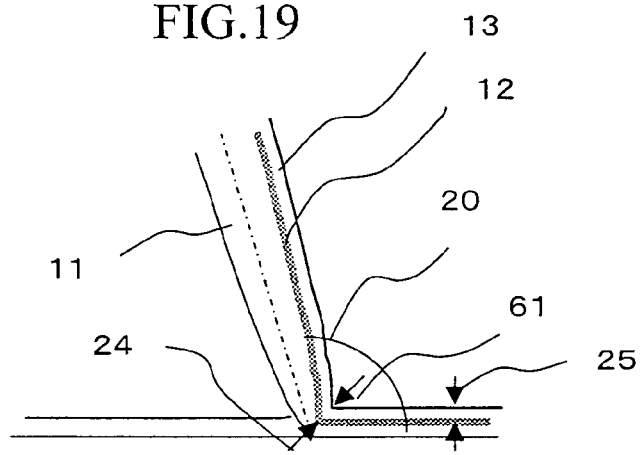
FIG. 19 is an enlarge diagram of a corner portion of a tapered select gate sidewall in a memory cell according to another embodiment of the present invention.

An enlarged diagram of the memory cell formed in FIG. 15 is shown in FIG. 3. However, FIG. 3 shows only the right-side cell of FIG. 15. Also, the diffusion layer 23 has the LDD structure and is composed of the high-concentration diffusion layer. When the bottom oxide film 11 of the self-aligned electrode is formed by the wet oxidation which is excellent in oxide film quality, a spindle-shaped oxide film denoted by the reference numeral 60 in FIG. 3 is formed by the enhanced oxidation of the polysilicon on the exposed sidewall of the select gate electrode in this oxidation. Such a state is in detail shown in FIG. 17. FIG. 17 is an enlarged diagram of the corner portion just after the process of the select gate sidewall by the dry etching. When forming the bottom oxide film with a thickness of 3 to 5 nm, the spindle-shaped oxide film 60 is formed by the enhanced oxidation of 4 to 8 nm of the sidewall of the select gate electrode. Therefore, the angle between the side surface of the oxide film 60 formed on the sidewall of the select gate and the substrate surface is reduced from the taper angle 61 of the select gate sidewall after the etching to an angle 20. When the angle 61 between the sidewall of the select gate electrode and the substrate surface is set at 100 degrees or more in consideration of this change after the oxidation, the angle 20 at the corner portion (taper angle of the bottom oxide film) after the oxidation is at least 95 degrees or more. Therefore, when the silicon nitride film 12 and the silicon oxide film 13 are sequentially deposited as shown in FIG. 19, the abnormal thickness reduction thereof at the corner portion can be prevented. More specifically, the thickness 24 of the discontinuity of the taper at the corner portion of the top oxide film 13 can be 80% or more of the thickness 25 of the top oxide film 13 on a flat portion. Consequently, it is possible to achieve the good charge storing characteristic.

Figure 22:
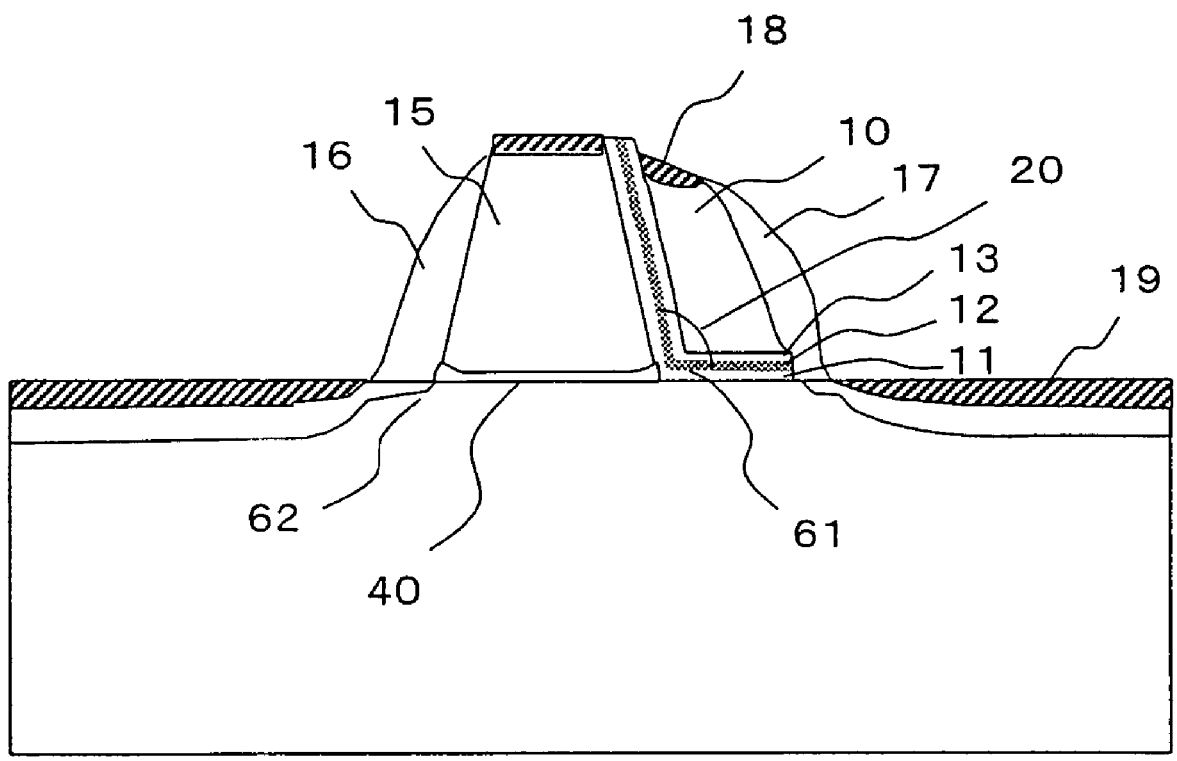
FIG. 22 is a sectional view of a memory cell, in which the taper of the select gate sidewall is controlled, according to another embodiment of the present invention.

It is also possible to form the bottom oxide film 11 of the ONO film by the dry oxidation or the ISSG oxidation. The sectional view of the memory cell in this case is shown in FIG. 22. Since the dry oxidation and the ISSG oxidation are characterized in that the enhanced oxidation amount of the polysilicon is small in comparison to the wet oxidation, the sidewall of the select gate electrode is oxidized almost uniformly. Therefore, if the angle 61 between the sidewall of the select gate electrode and the substrate surface is set at 95 degrees or more, the abnormal thickness reduction of the silicon nitride film and the silicon oxide film at the corner portion can be prevented. In the dry oxidation or the ISSG oxidation, bird's beak 62 at the lower portion of the select gate electrode is small in comparison to the wet oxidation. Therefore, it becomes possible to increase the on current by 15 to 20%.

Second Embodiment

Figure 4:
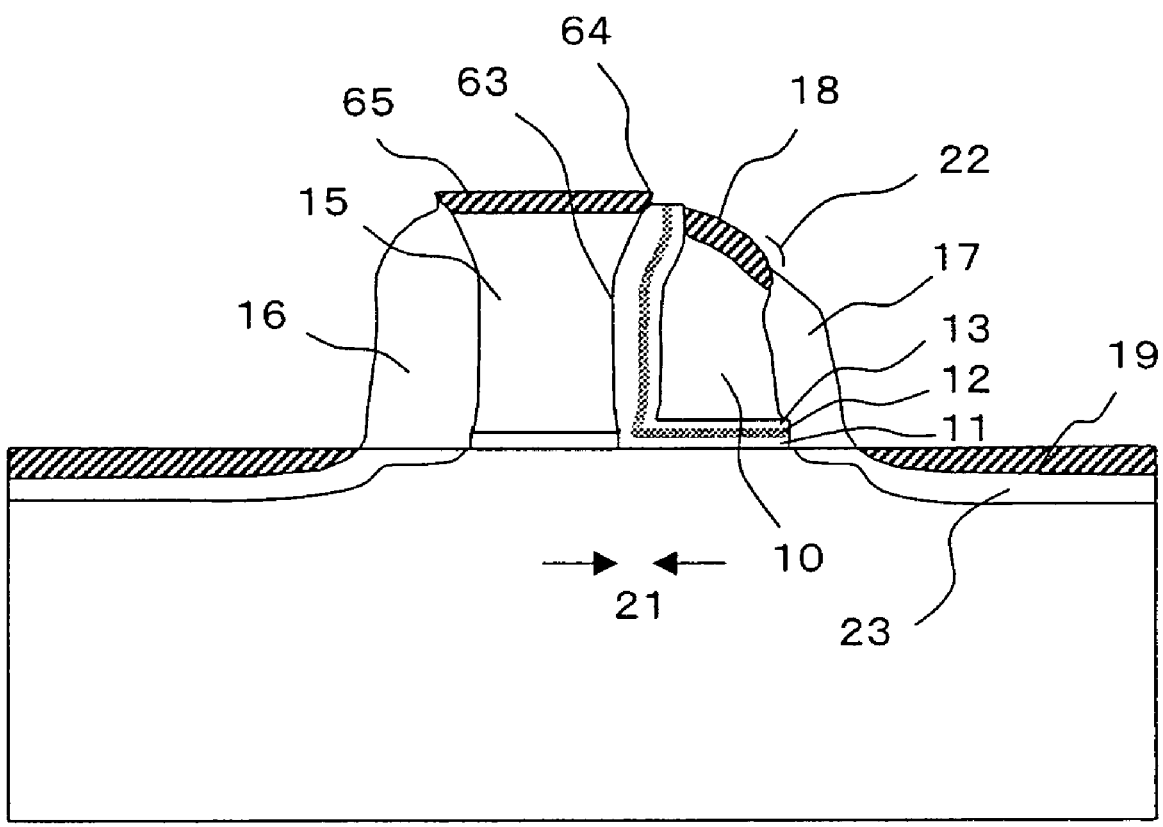
FIG. 4 is a sectional view of a memory cell, in which the select gate sidewall is recessed, according to another embodiment of the present invention.

Next, a second embodiment of the present invention will be described with reference to FIG. 4. In this embodiment, the manufacturing method in which the sidewall of the select gate electrode is recessed so as to stably perform the silicide process of the gate electrode will be described.

The description which overlaps with that of the first embodiment will be appropriately omitted. The process equal to that of the first embodiment shown in an explanatory diagram of FIG. 6 is performed. Subsequently, a polysilicon film and a silicon oxide film are deposited in the same manner, and the silicon oxide film and the polysilicon film are removed by the dry etching with using a photoresist patterned by the photolithography as a mask, whereby the select gate electrode is formed. In this process, the dry etching of the polysilicon sidewall is performed under the condition that the isotropic component is increased. By so doing, the sidewall is recessed as shown in FIG. 4. The recess amount 21 is defined as the distance between a portion 63 which is the innermost portion of the sidewall of the gate electrode and a perpendicular line from the edge 64 of the cap oxide film on the select gate to the silicon substrate when viewed from the cross section of the select gate.

Since the uppermost portion of the select gate electrode is hardly etched by the dry etching, it is also possible to define the recess amount as the distance between a portion 63 which is the innermost portion of the sidewall of the gate electrode and a perpendicular line from the uppermost edge of the select gate electrode 15 to the silicon substrate when viewed from the cross section of the select gate. The recess amount 21 is preferably set within a range of 20 to 60 nm. In this embodiment, the gate length of the self-aligned gate is 60 nm, and the minimum effective recess amount is 20 nm because approximately one-third of the gate length of the self-aligned gate electrode 10 is necessary in order to form the discontinuity 22 and completely expose the silicide portion 18. The maximum effective recess amount is at most equal to the gate length of the self-aligned gate, that is, 60 nm or less so that the recess does not hide the portion 18.

The recess is formed in the following manner. That is, in the anisotropic dry etching for vertically processing the polysilicon, the condition of the dry etching is changed to increase the isotropy near the end of the process. By so doing, the whole sidewall is recessed. As the methods for increasing the isotropy of the dry etching, the commonly known methods as follows are available. That is, the RF bias is controlled to reduce the etching ion components entered vertically; the deposition of the etching byproduct on the sidewall is reduced by changing the combination of the source gas, for example, reducing the carbon content in the etching gas; the source gas for the isotropic etching to be performed in a high rate is used, for example, using a chlorine-base etching gas instead of HBr; and the substrate temperature at the etching is increased to increase a rate of the isotropic etching. Alternatively, it is also possible to perform the isotropic etching of the sidewall by using an etching solution for dissolving the polysilicon such as hydronitric acid after the dry etching for vertically processing the sidewall.

Figure 20:
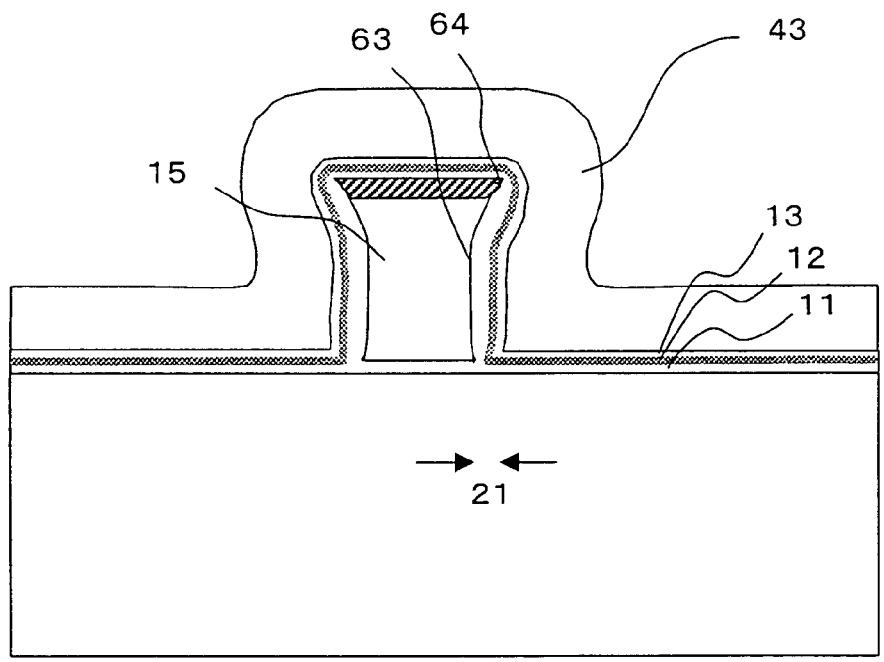
FIG. 20 is a sectional view for describing a manufacturing process of a memory cell, in which the select gate sidewall is recessed, according to another embodiment of the present invention.
Figure 21:
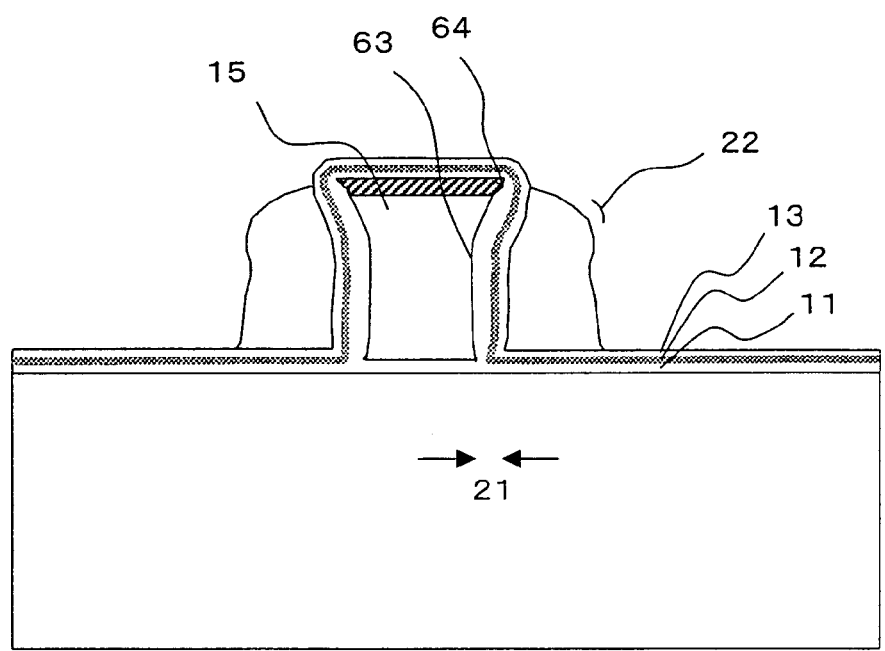
FIG. 21 is a sectional view for describing a manufacturing process of a memory cell, in which the select gate sidewall is recessed, according to another embodiment of the present invention.

In this case, the whole sidewall is recessed by increasing the isotropy by controlling the RF bias and changing the source gas near the end of the anisotropic dry etching process. Subsequently, the ONO film and the polysilicon are sequentially deposited as shown in FIG. 20. Since the polysilicon 43 has good step coverage in the CVD and the gate electrode is recessed from the lower portion of the cap oxide film 64, the deposited polysilicon 43 overhangs along the sidewall. Subsequently, since the etching of the part below the overhanging portion is delayed when the anisotropic etch back of the polysilicon is performed, the sidewall becomes almost vertical and the discontinuity 22 of the slope is surely formed as shown in FIG. 21. Therefore, it is possible to obtain the optimum shape of the sidewall of the self-aligned gate electrode. One of the sidewalls of the polysilicon formed on the both sides of the select gate electrode is removed by the dry etching with using a resist formed by the photolithography as a mask to left only the one side thereof.

An impurity is implanted (not shown) with using the select gate electrode and the self-aligned gate electrode as masks to form the LDD structure. Subsequently, a silicon oxide film with a thickness of 50 to 150 nm is deposited by the CVD and the anisotropic etch back is performed. Thereafter, a high-concentration impurity is implanted with using, as masks, the select gate electrode, the self-aligned gate electrode, and the sidewalls 16 and 17 of the silicon oxide film, and thus the structure shown in FIG. 4 is obtained. The diffusion layer 23 has the LDD structure and is composed of the high-concentration diffusion layer. Note that, since the thermal processing is appropriately performed, the impurity is diffused by this thermal processing. Since the recessed select gate electrode is used as a mask in the ion implantation for forming the LDD structure, the portion with a width almost equivalent to the recess amount in which the impurity region is not formed is provided between the channel forming region of the select gate and the diffusion layer on the side not having the self-aligned gate electrode 10. However, the impurity is diffused thereto by the thermal diffusion in the thermal processing.

The anisotropic etch back in this case is performed until the upper portion 65 of the select gate electrode and the polysilicon of the upper portion 18 of the self-aligned electrode to be silicided are exposed. However, in order to ensure the distance enough to prevent the short-circuit in the silicide process between the portion to be the silicide portion 18 of the self-aligned gate electrode and the portion to be the silicide portion 19 of the high-concentration diffusion layer on the substrate, it is necessary to sufficiently leave the outer sidewall 17 of the silicon oxide film. Usually, the sidewall formed vertically is hardly removed by the anisotropic etching. However, since the outer sidewall 17 is a second sidewall formed on the self-aligned electrode, it is obliquely formed and can be easily removed by the over etching and the margin is small.

In this second embodiment, since the sidewall of the select gate electrode is recessed, it is possible to obtain the ideal shape in which the outer slope of the self-aligned electrode is sharply changed to the vertical shape. As a result, the sufficient etching margin in the silicide process can be obtained and the process yield of a large number of memory cells can be improved. In addition, as the peculiar effect of this second embodiment, the problem of the high resistance due to the small cross-sectional area of the sidewall can be solved because the cross-sectional area of the self-aligned gate electrode is increased to reduce the resistance. Also, since the lowermost portion of the sidewall of the select gate electrode, the gate length of the select gate electrode can be made finer than the minimum processing dimension of the photolithography and, therefore, it becomes possible to increase the on current and to improve the operation speed. Simultaneously, it is also possible to reduce the memory size and to reduce the cost. Since the part of the self-aligned gate electrode adjacent to the silicon substrate is almost vertical and has a large thickness, the amount of ions passing through the bottom of the self-aligned gate electrode and causing the damages to the gate insulator in the ion implantation into the diffusion layer 23 can be reduced and thus reliability of the memory cell such as the charge storing characteristic and the endurance can be improved.

Third Embodiment

In this embodiment, the case where a step (convex portion) is provided between the select gate electrode and the self-aligned electrode so as to surely prevent the short-circuit in the silicide process will be described.

Since the process until the select gate electrode and the ONO film are formed is identical to that in the second embodiment, the description thereof will be omitted. Subsequently, a polysilicon film doped with an impurity to be the self-aligned electrode is deposited. The deposition thickness of the polysilicon film determines the gate length of the self-aligned electrode. The thickness is preferably within the range of 50 to 120 nm, and a polysilicon film with a thickness of 70 nm is deposited in this embodiment. When this polysilicon film is etched back by the anisotropic etching to form the self-aligned electrode, the over etching amount is increased to provide the step. It is preferable that the over etching of 20 to 80 nm is performed from the just etch state in which the polysilicon on the flat portion is removed. According to the examination, it is necessary that the step has at least 20 nm so as to surely isolate the silicide regions. In addition, it is also necessary that the maximum height of the step is smaller than that of the self-aligned gate electrode and, simultaneously, it is preferable that the electrode has a large height so as to increase the cross-sectional area in order to reduce the gate electrode resistance. More specifically, less than one-third of the electrode height of 250 nm, that is, 80 nm or less is suitable.

Figure 23:
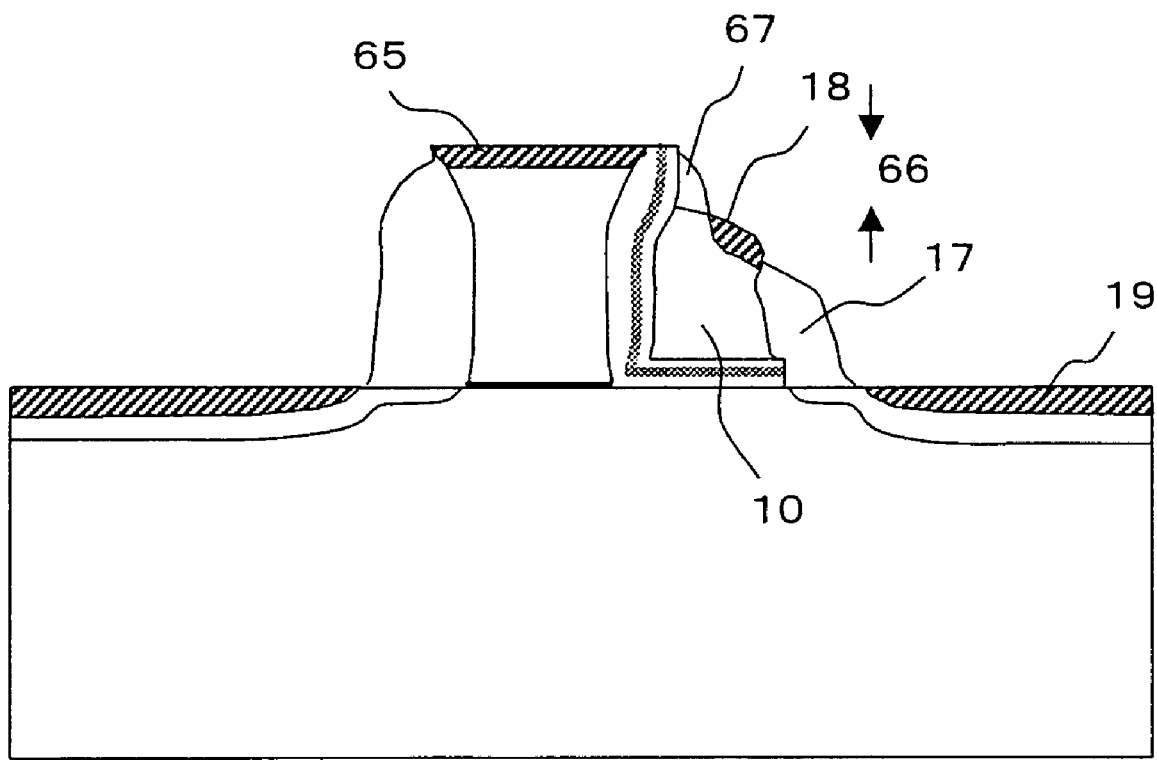
FIG. 23 is a sectional view of a memory cell, in which a step is provided between the select gate and the self-aligned gate electrode, according to another embodiment of the present invention.

Even when the over etch amount is increased more than usual, since the silicon nitride film which is hardly etched is left on the substrate, the substrate is protected. The cross section of the completed memory cell formed by the over etching of 50 nm is shown in FIG. 23. The length 66 between the upper portion of the select gate electrode and the upper portion of the self-aligned electrode is ensured to be 50 nm. Similarly to the above-described embodiments, the polysilicon on one side of the select gate electrode is removed.

Thereafter, a silicon oxide film with a thickness of 100 nm to be the spacer in order to isolate the self-aligned electrode and the high-concentration diffusion layer in the silicide process is deposited, and the silicon oxide film of both is etched back by the anisotropic etching, and the state in this step is shown in FIG. 23. The diffusion layer 23 in FIG. 23 is formed through the same process as that in the second embodiment. In the silicide process, it is necessary to pay attention to prevent the short-circuit between the upper portion 65 of the select gate electrode and the upper portion of the self-aligned electrode and the short-circuit between the diffusion layer 23 on the self-aligned electrode and the substrate, respectively.

In this embodiment, since the step is provided between the select gate electrode and the self-aligned electrode, a mini spacer 67 is formed due to the effect thereof. Therefore, the distance therebetween can be obtained and the select gate electrode and the self-aligned electrode can be surely isolated. The self-aligned gate electrode 10 and the diffusion layer 22 are also surely isolated by the outer sidewall spacer 17. A large amount of etch back is performed when forming the outer sidewall spacer. However, owing to the effect of the present invention having the vertical shape of the sidewall of the underlying self-aligned electrode, the resistance to the over etching is high and thus the film thickness reduction can be prevented.

Fourth Embodiment

In this embodiment, contrary to the third embodiment, the case where a step is provided so that the select gate electrode is located lower than the self-aligned electrode so as to surely prevent the short-circuit in the silicide process will be described.

Figure 24:
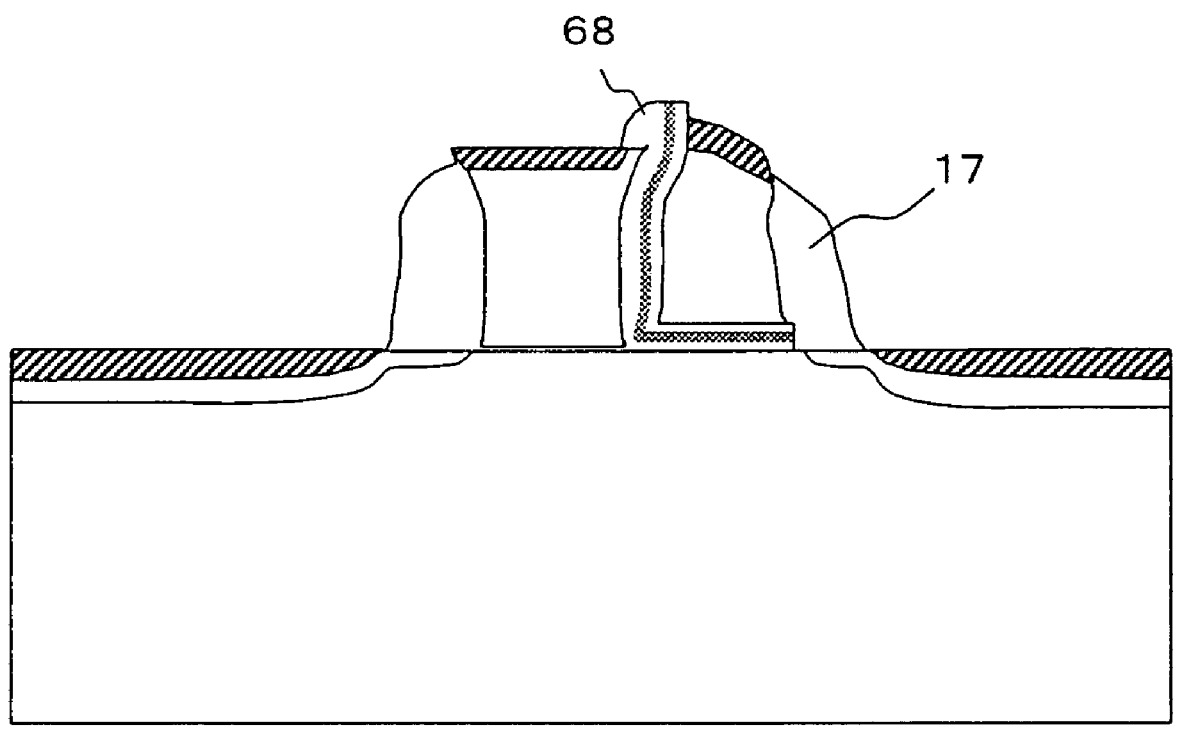
FIG. 24 is a sectional view of a memory cell, in which a step is provided between the select gate and the self-aligned gate electrode, according to another embodiment of the present invention.

In a fourth embodiment, a silicon oxide film with a thickness of 50 nm or larger is provided in the upper portion of the select gate electrode. Since the other process is identical to that in the second embodiment, the description thereof will be omitted. After forming the self-aligned gate electrode, a silicon oxide film with a thickness of 150 nm to be the LDD spacer is deposited. Then, the silicon oxide film is etched and the state is shown in FIG. 24. Since a mini spacer 68 is formed between the select gate electrode and the self-aligned electrode, the short-circuit therebetween in the silicide process can be prevented due to the effect thereof. The amount of the etch back to the outer LDD sidewall spacer 17 is increased by the amount equivalent to the cap thickness on the upper portion of the select gate electrode. However, since the sidewall of the underlying self-aligned electrode has an almost vertical shape in the present invention, the resistance to the over etching is high and thus the film thickness reduction can be prevented.

Fifth Embodiment

In this embodiment, the above-described first and second embodiments are combined. More specifically, the sidewall of the select gate electrode is tapered and recessed simultaneously to improve the charge storing characteristic and stabilize the silicide process.

Figure 1:
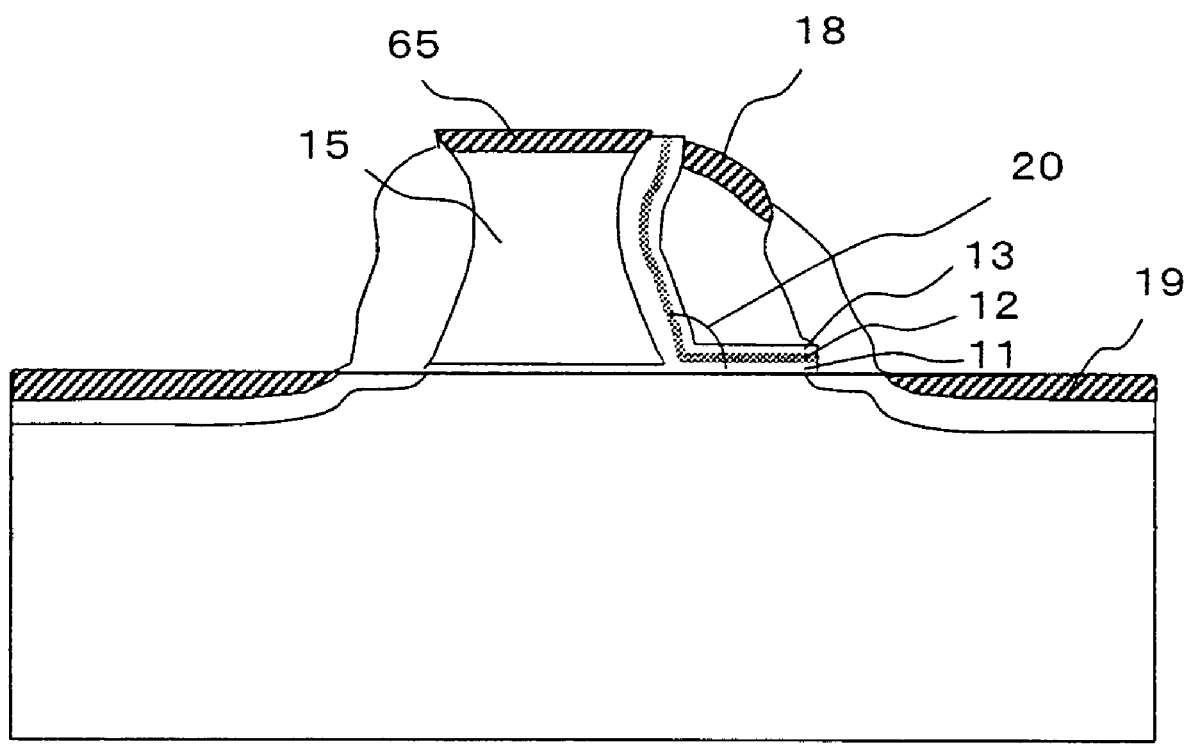
FIG. 1 is a sectional view of a memory cell, in which a taper of a select gate sidewall is controlled and the sidewall is recessed, according to an embodiment of the present invention.
Figure 2:
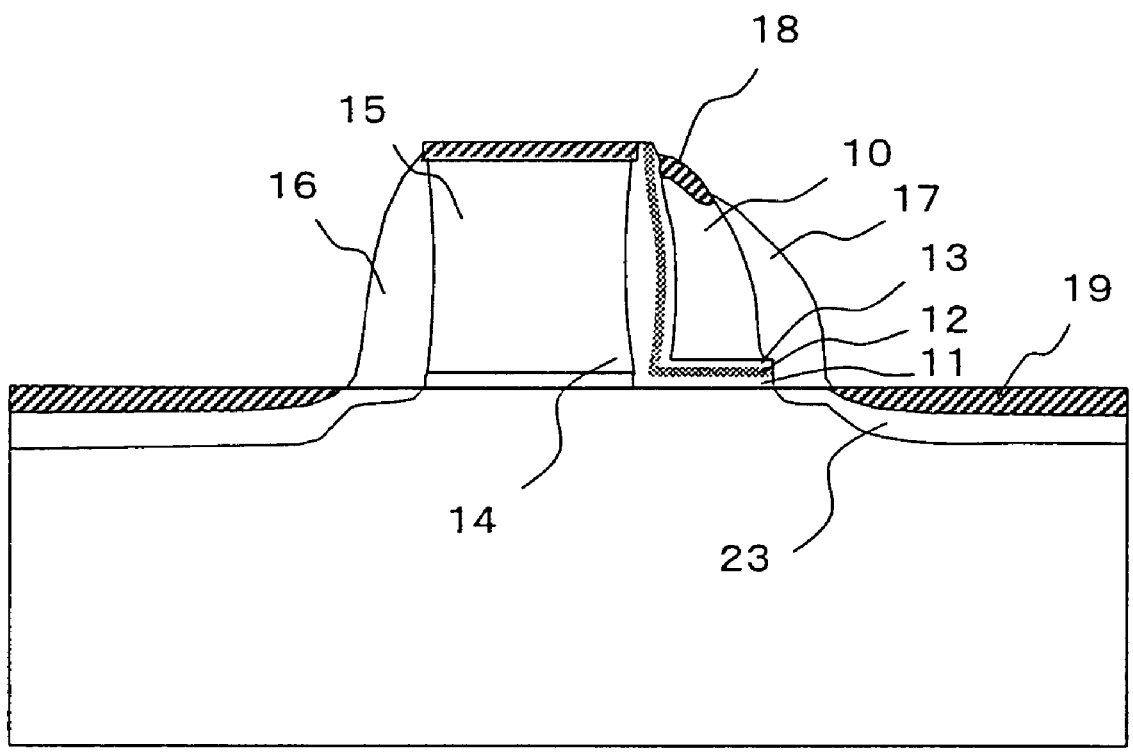
FIG. 2 is a sectional view showing an example of a conventional memory cell.

The process equal to that of the first embodiment shown in an explanatory diagram of FIG. 6 is performed. Then, a silicon oxide film and a polysilicon film are removed by the dry etching to form the select gate. In this dry etching of the sidewall of the polysilicon, the sidewall is recessed by increasing the isotropy in the early stage of the process, while the sidewall is tapered by delaying the removal of the sidewall in the latter stage of the process. The isotropy of the etching can be increased in the early stage of the process by using the usual methods described in the second embodiment. A well-known method can be used to form the taper of the sidewall in the latter stage of the process, for example, the carbon containing gas which can promote the deposition of the etching byproduct on the sidewall and prevent the etching of the sidewall is added. In this embodiment, the sidewall of the select gate is recessed by 30 nm and the angle 20 between the lower portion of the sidewall of the select gate and the silicon substrate surface is set to 100 degrees. The state after forming the self-aligned gate electrode and the LDD spacer through the same process as that of the first embodiment is shown in FIG. 1. The charge storing characteristic is improved by the effect of the taper of the sidewall of the select gate electrode, and the margin in the silicide process is increased by the effect of the recessed sidewall.

Sixth Embodiment

In this embodiment, the case where a sidewall spacer of a silicon oxide film is formed after forming the select gate electrode to control the angle at the corner portion of the ONO film will be described.

Figure 25:
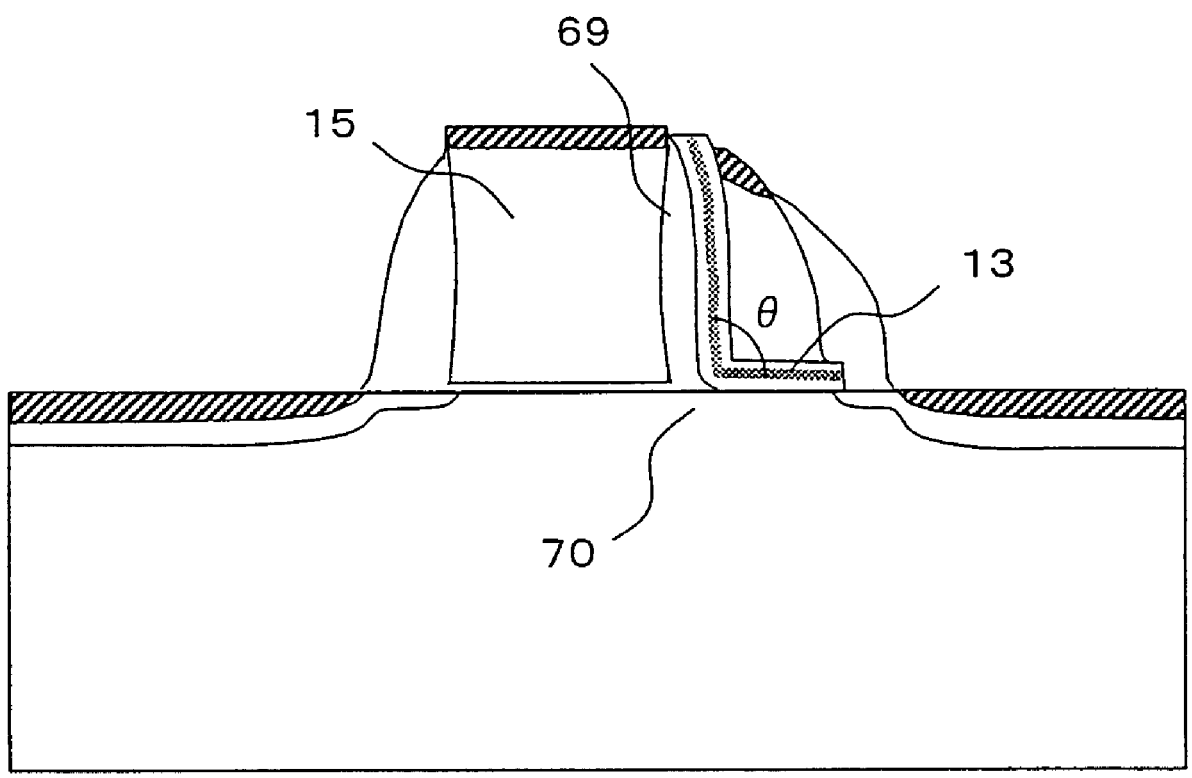
FIG. 25 is a sectional view of a memory cell, in which a spacer is provided between the select gate sidewall and the self-aligned gate electrode sidewall, according to another embodiment of the present invention.

The process equal to that of the first embodiment shown in an explanatory diagram of FIG. 6 is performed. Then, after forming the select gate electrode, a silicon oxide film with a thickness of 20 nm is deposited by the CVD. When the silicon oxide film is etched back until the silicon oxide surface, the spacer denoted by the reference numeral 69 shown in FIG. 25 is formed. By increasing the isotropy of the etching near the end of the etch back, the ideal round shape of the corner portion denoted by the reference numeral 70 can be formed. Although there are some methods to increase the isotropy, the method of increasing the etching selectivity of the silicon oxide film to the silicon is most preferable. In this case, the damage due to the etching on the silicon substrate on which the gate insulator is to be formed later becomes minimum. By depositing the ONO film in this state, the abnormal thickness reduction at the corner portion can be prevented and the thickness of the discontinuity of the taper at the corner portion of the top oxide film can be 80% or more of the thickness of the top oxide film on the flat portion. Therefore, it is possible to achieve the good charge storing characteristic.

Seventh Embodiment

In this embodiment, the case where the taper control of the ONO film is applied to a structure of a run-on type memory cell will be described. The process equal to that of the first embodiment shown in an explanatory diagram of FIG. 6 is performed.

Figure 26:
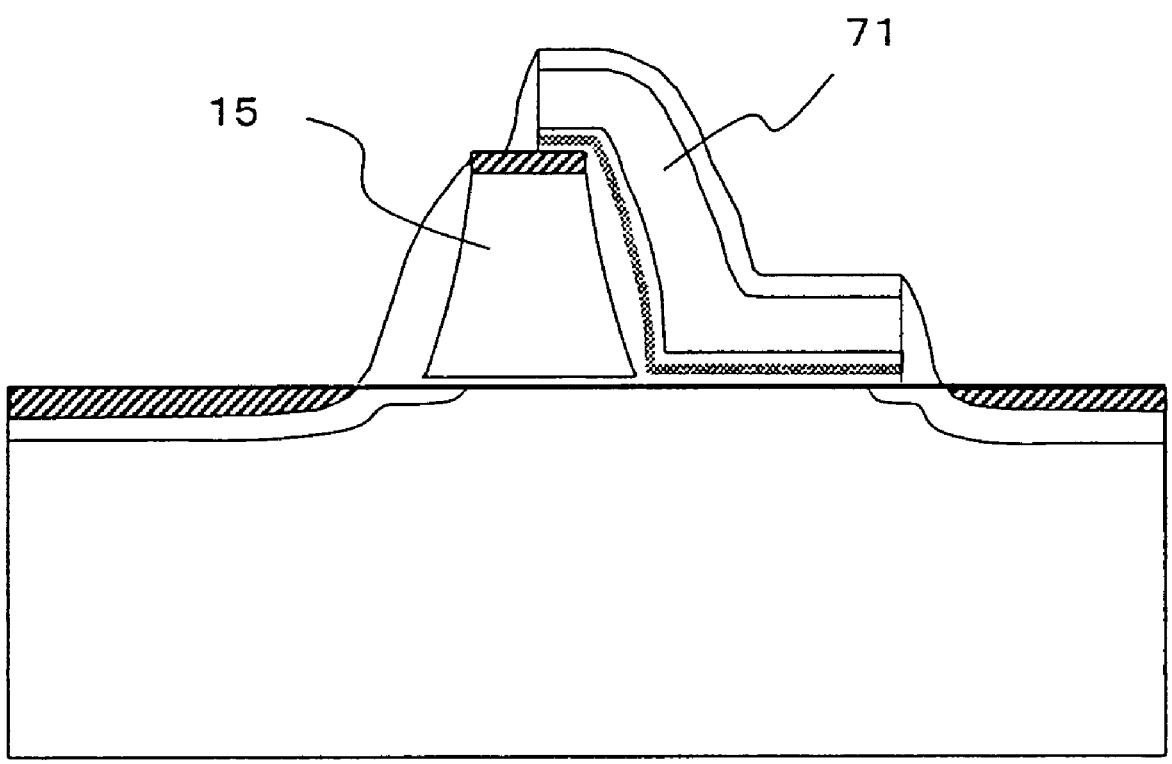
FIG. 26 is a sectional view of a memory cell, characterized by a structure in which the memory gate is run on the select gate, according to another embodiment of the present invention.

The taper at an angle of 100 degrees is provided on the sidewall of the select gate electrode to prevent the thickness reduction at the corner portion of the ONO film which stores the electric charges. Thereafter, a polysilicon film with a thickness of 100 to 200 nm to be an electrode of the memory transistor and to add an impurity is deposited. Subsequently, a silicon oxide film with a thickness of 50 nm as a cap oxide film is deposited. FIG. 26 shows the state where the gate electrode of the memory transistor is patterned by the photolithography and the silicon oxide film and the polysilicon film are removed by the dry etching to form the gate electrode of the memory transistor. The memory transistor 71 has such a structure as to run on the select gate electrode 15. Since the gate length is increased in comparison to the first to sixth embodiments in which the electrode is formed in a self-aligned manner, there are the drawbacks of reducing the on-state current and increasing the cell area. Meanwhile, this embodiment has the advantages that the cross-sectional area of the memory transistor is large, the gate resistance is low, and the electrode can be stably formed using the mask.

In the foregoing, the invention made by the inventors of the present invention has been concretely described based on the embodiments. However, needless to say, the present invention is not limited to the foregoing embodiments and can be variously modified and altered without departing from the gist thereof.

In FIGS. 3 and 22 of the first embodiment, the select gate electrode with a trapezoidal cross section is described. However, it is also possible to form the select gate electrode in the following manner. That is, the polysilicon is vertically processed by the anisotropic etching, and, in the latter stage of the process, the angle 61 at the lowermost sidewall of the select gate electrode is controlled within a range of 100 to 180 degrees except for 180 degrees by using the usual method. The lowermost sidewall of the select gate electrode is defined as a part of the sidewall of the select gate electrode under one-third or less of the height of the gate electrode on the surface of the gate insulator. In this case, the effect for preventing the abnormal thickness reduction at the corner portion can be similarly obtained, and if the formation angle 61 is equal, the area occupied by the select gate electrode can be reduced in comparison to the case where the select gate electrode is processed to have a trapezoidal cross section.

In addition, in the case where the bottom oxide film 11 of the ONO film is formed by the dry oxidation or the ISSG oxidation, the abnormal thickness reduction of the silicon nitride film and the silicon oxide film can be prevented by controlling the angle within the range of 95 to 180 degrees except for 180 degrees. Furthermore, the process of the gate electrode in the latter stage is not necessarily discontinuous. That is, even if the round shape is formed by gradually controlling the carbon content of the source gas for the dry etching, the abnormal thickness reduction of the silicon nitride film and the silicon oxide film can be prevented. The method of increasing the process capability to a vertical surface can be used to control the taper. More specifically, the method of increasing the ion energy in the dry etching or reducing the temperature and the method of increasing the deposition on the sidewall at the etching are available. When forming the taper, the process contrary to them is performed.

Each of the above-described embodiments is not necessarily used as an individual embodiment. The combination of two or more embodiments is also possible.

The present invention is effectively applied to a semiconductor device in which a nonvolatile semiconductor memory device is embedded on the same substrate along with a semiconductor device with a logic function such as a microcomputer.

What is claimed is:

1. A nonvolatile semiconductor memory device, comprising: over a main surface of a semiconductor substrate,
   a first insulator and a first gate electrode formed on said first insulator;
   a first corner portion formed between a sidewall of said first gate electrode and the main surface of said semiconductor substrate;
   a second insulator formed on the sidewall of said first gate electrode and on the main surface of said semiconductor substrate on one or both sides of said first gate electrode;
   a third insulator formed on said second insulator at said first corner portion;
   a fourth insulator formed on said third insulator at said first corner portion; and
   a second gate electrode formed on a sidewall of said first gate electrode and at a position opposite to the main surface of said semiconductor substrate on one or both sides of said first gate electrode via said second to fourth insulators,
   wherein a taper angle of said fourth insulator on the side of not having said first gate electrode is within a range of 95 to 180 degrees, exclusive of 180 degrees, and
   a thickness of a discontinuity of taper at said corner portion of said fourth insulator is 80% or more of that of said fourth insulator on a flat portion.

2. The nonvolatile semiconductor memory device according to claim 1,
   wherein a taper angle formed by said fourth insulator is within a range of 95 to 150 degrees, exclusive of 150 degrees.

3. A nonvolatile semiconductor memory device, comprising: over a main surface of a semiconductor substrate,
   a first insulator and a first gate electrode formed on said first insulator;
   a second insulator formed on a sidewall of said first gate electrode and on the main surface of said semiconductor substrate on one or both sides of said first gate electrode;
   a third insulator formed on said second insulator;
   a fourth insulator formed on said third insulator;
   a second gate electrode formed in a self-aligned manner on the sidewall of said first gate electrode and at a position opposite to the main surface of said semiconductor substrate on both sides of said first gate electrode via said second to fourth insulators; and
   a fifth insulator formed in a self-aligned manner on a side surface of said second gate electrode opposite to a side on which said fourth insulator is formed,
   wherein said second gate electrode has a discontinuity of an inclined angle on a side surface of said fifth insulator, and
   wherein a recess amount of said first gate electrode to an uppermost edge of said first gate electrode is from one-third of the gate length of said second gate electrode to the gate length thereof.

4. A nonvolatile semiconductor memory device, comprising: over a main surface of a semiconductor substrate,
   a first insulator and a first gate electrode formed on said first insulator;
   a spacer formed on a sidewall of said first gate electrode and at a position being in contact with a surface of said semiconductor substrate on one or both sides of said first gate electrode;
   a second insulator formed on said spacer;
   a third insulator formed on the surface of said semiconductor substrate on both sides of said first gate electrode;
   a fourth insulator formed on said second and third insulators;
   a fifth insulator formed on said fourth insulator; and
   a second gate electrode made of a conductive material formed on a sidewall of said first gate electrode and at a position opposite to the main surface of said semiconductor substrate on one or both sides of said first gate electrode via said spacer and said second to fifth insulators,
   wherein said spacer has a round shape at a lowermost portion of a side surface thereof being out of contact with said first gate electrode, and
   a thickness of said fifth insulator at said corner portion of said fifth insulator is 80% or more of that of said fifth insulator on a flat portion.

5. The nonvolatile semiconductor memory device according to claim 1,
   wherein a step between an upper edge of said first gate electrode and an upper edge of said second gate electrode has a height of 20 nm or more in a direction vertical to the main surface of said semiconductor substrate.

6. The nonvolatile semiconductor memory device according to claim 1,
   wherein said third insulator is a silicon nitride film.

* * * * *